(12) United States Patent
Jang

(10) Patent No.: US 7,811,912 B2
(45) Date of Patent: Oct. 12, 2010

(54) METHOD FOR MANUFACTURING SEMICONDUCTOR DEVICE

(75) Inventor: Young Geun Jang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 52 days.

(21) Appl. No.: 12/147,758

(22) Filed: Jun. 27, 2008

(65) Prior Publication Data

US 2009/0186478 A1    Jul. 23, 2009

(30) Foreign Application Priority Data

Jan. 22, 2008    (KR)    ................. 10-2008-0006468

(51) Int. Cl.
*H01L 21/261* (2006.01)
*H01L 21/26* (2006.01)

(52) U.S. Cl. ............... 438/513; 438/687; 438/688; 438/712; 257/E21.006; 257/E21.17; 257/E21.218; 257/E21.249; 257/E21.267; 257/E21.319; 257/E21.304; 257/E21.321

(58) Field of Classification Search .............. 438/50, 438/106, 509, 513, 680.675, 687, 688, 692, 438/142, 712; 257/E21.17, 6, 218, 249, 267, 257/319, 304, 321
See application file for complete search history.

(56) References Cited

U.S. PATENT DOCUMENTS 5,869,149 A * 2/1999 Denison et al. ............. 427/579
5,908,672 A * 6/1999 Ryu et al. ................... 427/574
6,008,120 A * 12/1999 Lee ............................ 438/634
6,103,601 A * 8/2000 Lee et al. .................... 438/513
6,413,871 B2 * 7/2002 M'Saad et al. ............. 438/692

FOREIGN PATENT DOCUMENTS

| JP | 2004-296515 | 10/2004 |
|---|---|---|
| JP | 2004-296516 | 10/2004 |
| KR | 10-0250731 | 1/2000 |
| KR | 10-2005-0059400 | 6/2005 |
| KR | 100510464 B1 | 8/2005 |
| KR | 100676521 B1 | 1/2007 |

* cited by examiner

*Primary Examiner*—David Nhu
(74) *Attorney, Agent, or Firm*—Marshall, Gerstein & Borun LLP

(57) ABSTRACT

A method for manufacturing a semiconductor device includes the steps of forming a first insulation layer on a substrate; forming a damascene pattern in the first insulation layer; conducting a first process for forming metal lines in the damascene pattern; conducting a second process for forming a second insulation layer, having compressive stress greater than tensile stress of the metal lines, on the damascene pattern including the metal lines; forming a passivation layer on the substrate after multi-layered metal lines are formed by the first and second processes; and conducting an annealing process for the substrate including the passivation layer.

21 Claims, 2 Drawing Sheets

METHOD FOR MANUFACTURING SEMICONDUCTOR DEVICE

CROSS-REFERENCES TO RELATED APPLICATIONS

The priority to Korean patent application number 10-2008-0006468, filed on Jan. 22, 2008, is hereby claimed and the disclosure thereof is incorporated by reference herein in its entirety.

BACKGROUND OF THE INVENTION

The present invention relates to a method for manufacturing a semiconductor device, which can reduce or prevent the warpage of a substrate in the manufacture of a semiconductor device so that the warpage of a chip can be suppressed even without modifying a packaging process, thereby preventing a defective package from being caused.

In general, a wafer, in which memory devices are formed, is sawn into chips which in turn are packaged through a packaging process. In the packaging process, the degree of warpage present in the chip can cause a defective package due to, for example, a wire bonding failure or a die lifting phenomenon upon stacking multiple chips.

In order to enable the packaging process, the back surface of a wafer is first grinded by a preset thickness. At this time, warpage markedly occurs on the front surface of the wafer. This results from the fact that, after conducting a multi-layered metal line forming process using a metal line material having high tensile stress, such as aluminum (Al) and tungsten (W), and depositing a passivation layer, when conducting an annealing process, the compressive stress of insulation layers is considerably removed, and tensile stress exists in the wafer.

In the conventional art, if a wire bonding failure in a chip package or a die lifting phenomenon in a stack package occurs due to the warpage of a chip or chips, high bonding force is applied in the packaging process or die attachment parameters on the package are changed. However, these methods result in the deterioration of the packaging efficiency and the extension of a processing time.

SUMMARY OF THE INVENTION

Preferred embodiments of the present invention are directed to a method for manufacturing a semiconductor device which can adjust the stress of an insulation layer between upper and lower metal lines. Accordingly, such embodiments can be used to at least reduce the warpage of a substrate in the manufacture of a semiconductor device so that the warpage of a chip can be suppressed, preferably even without modifying a packaging process in a chip packaging stage, and thereby reducing or preventing a defective package from being caused and increasing packaging efficiency.

In a first embodiment, a method for manufacturing a semiconductor device comprises the steps of providing a semiconductor substrate and forming multi-layered metal lines on the substrate by a sequence comprising forming a first insulation layer on the substrate, forming a damascene pattern in the first insulation layer, forming first metal lines having tensile strength in the damascene pattern, and forming a second insulation layer having compressive stress greater than the tensile stress of the first metal lines, on the damascene pattern including the first metal lines; and then forming a passivation layer on the substrate after the multi-layered metal lines are formed; and annealing the substrate including the passivation layer.

In a second embodiment, a method for manufacturing a semiconductor device comprises the steps of providing a semiconductor substrate; forming multi-layered metal lines on the substrate by a sequence comprising forming first metal lines having tensile stress on the substrate, forming a first insulation layer to fill gaps between the metal lines, and forming a second insulation layer having compressive stress greater than the tensile stress of the metal lines, on the first metal lines and the first insulation layer; and then forming a passivation layer on the substrate after multi-layered metal lines are formed; and annealing the substrate including the passivation layer.

The multi-layered metal lines comprising metal lines in a first insulating layer with an overlying second layer can be formed by performing the foregoing sequence of the first embodiment at least two times, or performing the foregoing sequence of the second embodiment at least two times, or by performing any combination including the sequence of the first embodiment and the sequence of the second embodiment.

In still another embodiment, a method for manufacturing a semiconductor device comprises the steps of providing a substrate in which a first insulation layer is formed between metal lines having tensile stress; and forming a second insulation layer having compressive stress greater than the tensile stress of the metal lines, on the metal lines and the first insulation layer.

Any of the embodiments can include any combination of the preferred steps and features described below.

The metal lines preferably are formed of aluminum (Al) or copper (Cu). The second insulation layer preferably is formed as a plasma enhanced chemical vapor deposition (PECVD) oxide layer.

The PECVD oxide layer preferably is deposited through PECVD using $O_3$, $O_2$ and TEOS gases as reactant gases. The PECVD oxide layer preferably is deposited through PECVD using $N_2$ and He gases in addition to the reactant gases.

The PECVD oxide layer preferably is deposited using double source power. Preferably, the double source power simultaneously employs a first high frequency of about 13.56 MHz and a second high frequency up to several KHz, as a reaction source. The PECVD oxide layer preferably is deposited by adjusting the reaction source power in the range of about 1,000 to about 2,000 W. The PECVD oxide layer preferably is deposited by adjusting an amount of the TEOS gas in the range of about 500 to about 4,000 sccm.

Overall compressive stress of the second insulation layer preferably is at least decreased by the annealing process.

In a preferred variation of either embodiment, after the multi-layered metal lines are formed, the difference between overall tensile stress of the metal lines and overall compressive stress of the second insulation layer is decreased by the annealing process.

The first insulation layer preferably is formed as an HDP oxide layer.

BRIEF DESCRIPTION OF THE DRAWINGS

FIGS. 2 and 1B through 1E are sectional views illustrating the processes of a method for manufacturing a semiconductor device in accordance with a second embodiment of the present invention.

DESCRIPTION OF SPECIFIC EMBODIMENTS

Reference will now be made in greater detail to more specific embodiments of the invention, examples of which are illustrated in the attached drawings. The present invention must not be construed as being limited by the following embodiments and can be realized in a variety of ways.

FIGS. 1A through 1E are sectional views illustrating the processes of a method for manufacturing a semiconductor device in accordance with a first embodiment of the present invention.

Figure 1A:
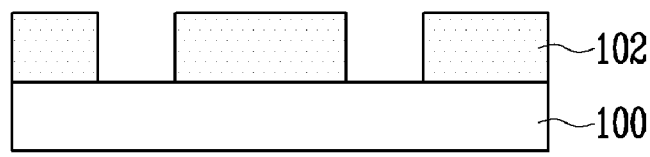
FIGS. 1A through 1E are sectional views illustrating the processes of a method for manufacturing a semiconductor device in accordance with a first embodiment of the present invention.

Referring to FIG. 1A, a first interlayer dielectric is formed on a substrate 100 which is formed with semiconductor elements, such as transistors (not shown) and/or capacitors (not shown). Then, by etching portions of the first interlayer dielectric, trenches are defined to form a first interlayer dielectric layer pattern 102. By this process, a damascene pattern 102, in which trenches are defined in a first interlayer dielectric, is formed.

Figure 1B:
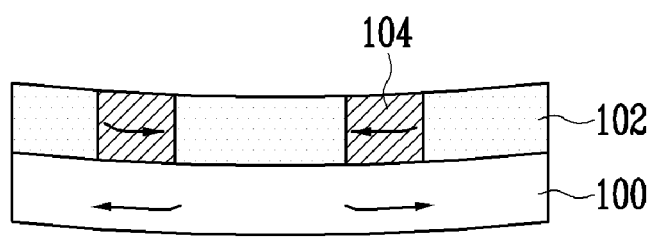

Referring to FIG. 1B, after forming a metal layer by depositing a metallic material on the damascene pattern in such a way as to fill the trenches, an etching process is conducted to remove the metal layer until the first interlayer dielectric 102 is exposed. The metal layer preferably is formed of Al or Cu in order to reduce the specific resistance of metal lines to be subsequently formed. The etching process for the metal layer preferably is a chemical mechanical polishing (CMP) process.

Through this process, as the metal layer remains only in the trenches of the damascene pattern, first metal lines 104 are formed. However, Al and Cu which can be used for forming the first metal lines 104 have high tensile stress.

Therefore, if the first metal lines 104 are formed on the substrate 100 and have high tensile strength, e.g. due to using Al or Cu having high tensile stress, due to the high tensile stress of the first metal lines 104, as the edges of the substrate 100 are raised, warpage of the substrate 100 can occur on the front surface of the substrate 100 (i.e., the top surface as illustrated in FIG. 1B takes on a concave profile). In FIG. 1B, the arrows shown in the first metal lines 104 indicate the direction of the tensile stress induced in the first metal lines 104, and the arrows shown in the substrate 100 indicate the reaction against the tensile stress induced in the first metal lines 104 as force for causing the substrate 100 to be warped.

Figure 1C:
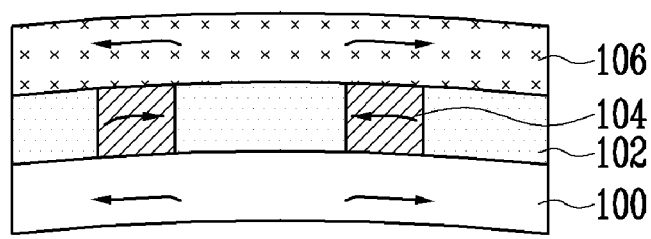

Referring to FIG. 1C, an inter-metal line dielectric layer 106 is formed on the damascene pattern including the first metal lines 104.

In this first embodiment of the present invention, the first inter-metal line dielectric layer 106 preferably is formed as an oxide layer having compressive stress greater than the tensile stress of the first metal lines 104. Preferably, the oxide layer having high compressive stress can comprise an oxide layer formed through plasma enhanced chemical vapor deposition, i.e., a PECVD oxide layer. Preferably, the PECVD oxide layer is deposited through a PECVD process using $O_3$, $O_2$ and tetra ethyl ortho silicate (TEOS) gases as reactant gases, and more preferably at a temperature in a range of about 350 to about 400° C. In addition to the reactant gases, $N_2$ and He gases preferably are used. In a preferred embodiment, $N_2$ and He gases are used to increase the uniformity of the thin film to be deposited.

To allow the PECVD oxide layer to have high compressive stress, when depositing the PECVD oxide layer, preferably a double source power is used. In a preferred embodiment, the double source power employed as a reaction source simultaneously uses a first high frequency of about 13.56 MHz and a second high frequency up to several KHz. Further preferably, reaction source power is adjusted in the range of about 1,000 to 2,000 W. Preferably, a low deposition speed is used. For example, the amount of the TEOS gas preferably is adjusted in the range of about 500 to about 4,000 sccm to obtain a low deposition speed.

As described above, by forming the first inter-metal line dielectric layer 106 on the substrate 100 warped on the front surface thereof as an oxide layer having a compressive stress greater than the tensile stress of the first metal lines 104, due to the high compressive stress of the first inter-metal line dielectric layer 106 the warpage of the substrate 100 occurs such that the edges of the substrate 100 are warped downwardly on the back surface of the substrate 100 (bottom surface of substrate 100 as shown in FIG. 1C). In FIG. 1C, the arrows shown in the first inter-metal line dielectric layer 106 indicate the direction of the compressive stress induced in the first inter-metal line dielectric layer 106, the arrows shown in the first metal lines 104 indicate the direction of the tensile stress induced in the first metal lines 104, and the arrows shown in the substrate 100 indicate the reaction against the tensile stress induced in the first metal lines 104 as force for causing the substrate 100 to be warped.

Figure 1D:
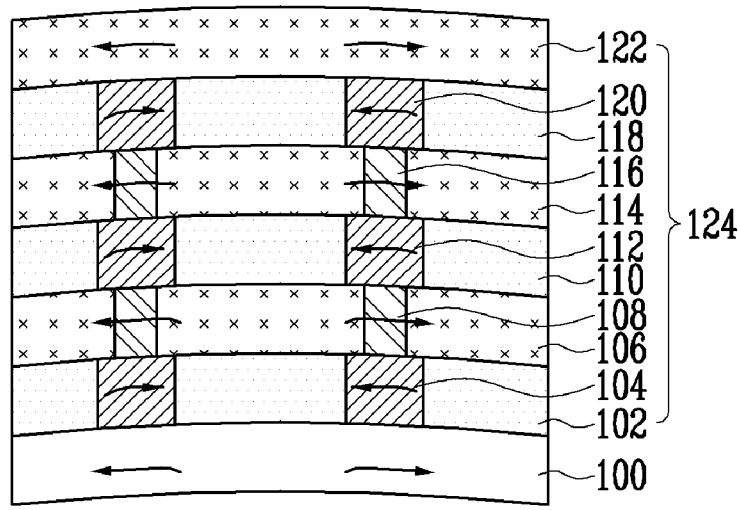

Referring to FIG. 1D, by etching portions of the first inter-metal line dielectric layer 106, first contact holes (which later are filled to be contact plugs 108) are defined to expose the first metal lines 104. Then, after forming a metal layer by depositing a metallic material on the first inter-metal line dielectric layer 106 including the first contact holes, an etching process is conducted for the metal layer until the first inter-metal line dielectric layer 106 is exposed. Preferably, the etching process for the metal layer is conducted as a CMP process. Through this process, as the metal layer remains only in the first contact holes, first contact plugs 108 are formed.

Next, by repeatedly conducting processes such as the first process for forming the first metal lines 104, the second process for forming the first inter-metal line dielectric layer 106 on the first metal lines 104, and processes for forming the first contact plugs 108, second metal lines 112, a second inter-metal line dielectric layer 114, second contact plugs 116, third metal lines 120, and a third inter-metal line dielectric layer 122 are formed. Through this process, multi-layered metal lines 124 including the first through third metal lines 104, 112 and 120 and the first through third inter-metal line dielectric layers 106, 114 and 122 are formed on the substrate 100. When forming the multi-layered metal lines 124, by adjusting the number of times for repeatedly conducting the a process for forming metal lines 104, a process for forming an inter-metal line dielectric layer, together with a process for forming contact plugs in the inter-metal line dielectric layer, as appropriate, the number of layers of the multi-layered metal lines 124 can be controlled as desired.

In the course of forming the multi-layered metal lines 124, second and third interlayer dielectrics 110 and 118 are formed, and second contact plugs 116 are formed.

In the multi-layered metal lines 124 formed through the first and second processes as described above, the overall compressive stress of the inter-metal line dielectric layers that is obtained by adding the compressive stress of the first through third inter-metal line dielectric layers 106, 114 and 122 is preferably greater than the overall tensile stress of the metal lines that is obtained by adding the tensile stress of the first through third metal lines 104, 112 and 120. Accordingly, due to the compressive stress existing in the substrate 100 which is formed with the multi-layered metal lines 124, the warpage of the substrate 100 occurs such that the edges of the substrate 100 are warped on the back surface of the substrate 100.

In FIG. 1D, the arrows shown in the first through third inter-metal line dielectric layers 106, 114 and 122 indicate the direction of the compressive stress induced in the first through third inter-metal line dielectric layers 106, 114 and 122, the arrows shown in the first through third metal lines 104, 112 and 120 indicate the direction of the tensile stress induced in the first through third metal lines 104, 112 and 120, and the arrows shown in the substrate 100 indicate the reaction against the tensile stress induced in the first through third metal lines 104, 112 and 120 as force for causing the substrate 100 to be warped.

Figure 1E:
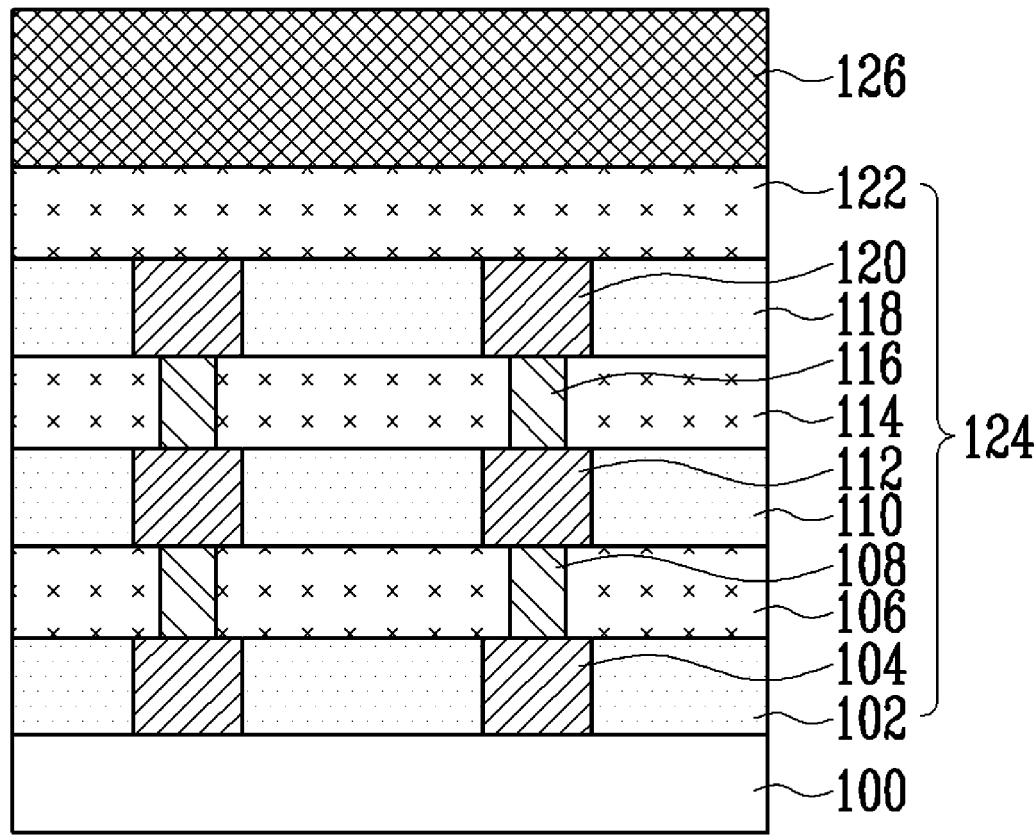

Referring to FIG. 1E, after forming a passivation layer 126 on the substrate 100 including the multi-layered metal lines 124, an annealing process is conducted, preferably at a temperature in a range of about 300 to about 400° C.

In this embodiment, since the overall compressive stress of the first through third inter-metal line dielectric layers 106, 114 and 122 is decreased by the annealing process, as a result, the difference between the overall tensile stress of the metal lines including the first through third metal lines 104, 112 and 120 and the overall compressive stress of the inter-metal line dielectric layers including the first through third inter-metal line dielectric layers 106, 114 and 122 in the multi-layered metal lines 124 is decreased. According to this process, by minimizing the deformation of the substrate 100, the warpage of the substrate 100 can be significantly reduced.

While not shown in the drawings, after the processes for manufacturing a semiconductor device are completed as shown in FIG. 1E, the substrate 100 can be subsequently sawn into chips which, in turn, can be packaged through a packaging process.

If the warpage of the substrate 100 is reduced in the processes for manufacturing a semiconductor device as described above, the warpage of a chip can be effectively suppressed even without modifying a packaging process in a subsequent chip packaging stage, whereby it is possible to prevent the occurrence of a wire bonding failure or a die lifting phenomenon upon stacking multiple chips, and packaging efficiency can be increased.

FIGS. 2 and 1B through 1E are sectional views illustrating the processes of a method for manufacturing a semiconductor device in accordance with a second embodiment of the present invention.

Figure 2:
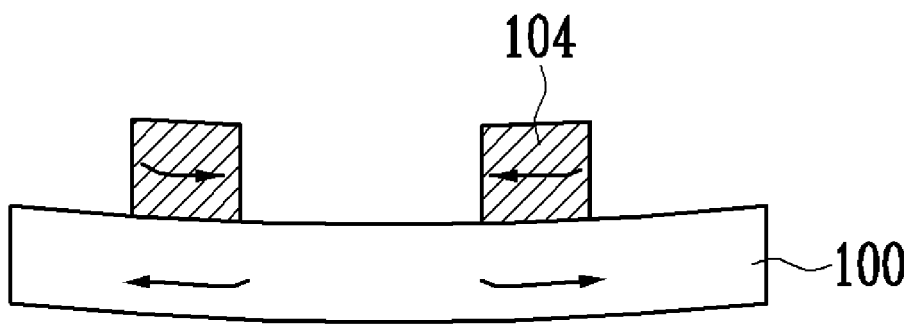

Referring to FIG. 2, a metal layer is formed on a substrate 100 which is formed with semiconductor elements, such as transistors (not shown) and/or capacitors (not shown). The metal layer preferably can be formed of Al or Cu, for example in order to reduce the specific resistance of metal lines to be subsequently formed.

Thereafter, by patterning the metal layer through an etching process using a mask (not shown), a plurality of first metal lines 104 are formed, preferably at regular intervals. Preferably, the etching process for the metal layer is conducted as a dry etching process. Preferably, the etching process can be conducted as a reactive ion etching (RIE) process.

However, Al and Cu used for forming the first metal lines 104 have high tensile stress. Therefore, if the first metal lines 104 are formed on the substrate 100 using Al or Cu having high tensile stress, due to the high tensile stress of the first metal lines 104, as the edges of the substrate 100 are raised, the warpage of the substrate 100 occurs on the front surface of the substrate 100. Here, the arrows shown in the first metal lines 104 indicate the direction of the tensile stress induced in the first metal lines 104, and the arrows shown in the substrate 100 indicate the reaction against the tensile stress induced in the first metal lines 104 as force for causing the substrate 100 to be warped.

Referring to FIG. 1B, after forming a first interlayer dielectric 102 on the substrate 100 including the first metal lines 104 to fill the gaps between the first metal lines 104, a planarization etching process is conducted for the first interlayer dielectric 102. It is preferred that the first interlayer dielectric 102 be formed through high density plasma chemical vapor deposition (HDP CVD) as an HDP oxide layer so that the first interlayer dielectric 102 can easily fill the gaps between the first metal lines 104.

Here, the planarization etching process preferably can be conducted as a CMP process. In the CMP process, etching can be conducted to etch the first interlayer dielectric 102 until the first metal lines 104 are exposed. Conversely, while not shown in the drawings, the etching of the first interlayer dielectric 102 may be stopped before the first metal lines 104 are exposed.

Then, the subsequent processes as shown in FIGS. 1C through 1E are conducted. Through this process, a first inter-metal line dielectric layer 106 having compressive stress greater than the tensile stress of the first metal lines 104 is formed on the first metal lines 104 and the first interlayer dielectric 102. Thereupon, after forming multi-layered metal lines 124 by repeatedly conducting a first process for forming metal lines, a second process for forming an interlayer dielectric, and a third process for forming an inter-metal line dielectric layer 106, a passivation layer 126 is formed and an annealing process is conducted.

Since the processes after forming the first interlayer dielectric 102 are the same as those of the first embodiment as shown in FIG. 1C through 1E except that second and third metal lines 112 and 120 are formed not through a damascene process but by patterning through an RIE process, the detailed description thereof is not repeated here. In this second embodiment of the present invention, the same effects as the first embodiment can be accomplished.

The present invention preferably confers one or more advantages as described below.

First, in the manufacture of a semiconductor device, due to the fact that an insulation layer between upper and lower metal lines is formed as an oxide layer having compressive stress greater than the tensile stress of the metal lines, the warpage of a substrate can be at least reduced when conducting an annealing process after depositing a passivation layer. As a consequence, the warpage of a chip can be effectively suppressed even without modifying a packaging process in a chip packaging stage, thereby preventing the occurrence of a wire bonding failure or a die lifting phenomenon upon stacking multiple chips.

Second, since the warpage of a chip can be effectively suppressed even without modifying a packaging process and it is possible to prevent a defective package from being caused, and the packaging efficiency can be increased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising:
   providing a semiconductor substrate;
   forming multi-layered metal lines on the semiconductor substrate by a sequence comprising,
   forming a first insulation layer on the semiconductor substrate;
   forming a damascene pattern in the first insulation layer;

forming metal lines having tensile stress in the damascene pattern;

forming a second insulation layer having compressive stress greater than the tensile stress of the metal lines, on the damascene pattern including the metal lines;

forming a passivation layer on the semiconductor substrate after forming the multi-layered metal lines; and annealing the semiconductor substrate including the passivation layer to decrease a difference between overall tensile stress of the metal lines and overall compressive stress of the second insulation layer.

2. The method for manufacturing a semiconductor device according to claim 1, comprising forming the metal lines of aluminum or copper.

3. The method for manufacturing a semiconductor device according to claim 1, comprising forming the second insulation layer as a plasma-enhanced chemical vapor deposition (PECVD) oxide layer.

4. The method for manufacturing a semiconductor device according to claim 3, comprising depositing the PECVD oxide layer through PECVD using $O_3$, $O_2$, and tetra ethyl ortho silicate (TEOS) gases as reactant gases.

5. The method for manufacturing a semiconductor device according to claim 4, comprising depositing the PECVD oxide layer through PECVD using $N_2$ and He gases in addition to the reactant gases.

6. The method for manufacturing a semiconductor device according to claim 3, comprising depositing the PECVD oxide layer using double source power.

7. The method for manufacturing a semiconductor device according to claim 6, wherein the double source power simultaneously employs a first high frequency of about 13.56 MHz and a second high frequency up to several KHz, as a reaction source.

8. The method for manufacturing a semiconductor device according to claim 3, comprising depositing the PECVD oxide layer by adjusting the reaction source power to a value in a range of about 1,000 W to about 2,000 W.

9. The method for manufacturing a semiconductor device according to claim 4, comprising depositing the PECVD oxide layer by adjusting the amount of the TEOS gas to a value in a range of about 500 sccm to about 4,000 sccm.

10. The method for manufacturing a semiconductor device according to claim 1, comprising annealing the semiconductor substrate including the passivation layer to an extent to decrease overall compressive stress of the second insulation layer.

11. A method for manufacturing a semiconductor device, comprising:

providing a semiconductor substrate;

forming multi-layered metal lines on the semiconductor substrate by a sequence comprising, forming metal lines having tensile stress on the semiconductor substrate;

forming a first insulation layer to fill gaps between the metal lines;

forming a second insulation layer having a compressive stress greater than the tensile stress of the metal lines, on the metal lines and the first insulation layer;

forming a passivation layer on the semiconductor substrate after forming the multi-layered metal lines; and annealing the semiconductor substrate including the passivation layer to decrease a difference between overall tensile stress of the metal lines and overall compressive stress of the second insulation layer.

12. The method for manufacturing a semiconductor device according to claim 11, wherein the metal lines are formed of aluminum or copper.

13. The method for manufacturing a semiconductor device according to claim 11, comprising forming the second insulation layer as a plasma-enhanced chemical vapor deposition (PECVD) oxide layer.

14. The method for manufacturing a semiconductor device according to claim 13, comprising depositing the PECVD oxide layer through PECVD using $O_3$, $O_2$, and tetra ethyl ortho silicate (TEOS) gases as reactant gases.

15. The method for manufacturing a semiconductor device according to claim 14, comprising depositing the PECVD oxide layer through PECVD using $N_2$ and He gases in addition to the reactant gases.

16. The method for manufacturing a semiconductor device according to claim 13, comprising depositing the PECVD oxide layer using double source power.

17. The method for manufacturing a semiconductor device according to claim 16, wherein the double source power simultaneously employs first high frequency of about 13.56 MHz and second high frequency up to several KHz, as a reaction source.

18. The method for manufacturing a semiconductor device according to claim 13, comprising depositing the PECVD oxide layer by adjusting the reaction source power to a value in a range of about 1,000 W to about 2,000 W.

19. The method for manufacturing a semiconductor device according to claim 14, comprising depositing the PECVD oxide layer by adjusting the amount of the TEOS gas to a value in a range of about 500 sccm to about 4,000 sccm.

20. The method for manufacturing a semiconductor device according to claim 11, comprising annealing the semiconductor substrate including the passivation layer to an extent to decrease overall compressive stress of the second insulation layer.

21. The method for manufacturing a semiconductor device according to claim 11, comprising forming the first insulation layer as a high-density plasma (HDP) oxide layer.

* * * * *